(12) United States Patent
Finders

(10) Patent No.: US 7,961,296 B2
(45) Date of Patent: Jun. 14, 2011

(54) LITHOGRAPHIC APPARATUS AND DEVICE MANUFACTURING METHOD

(75) Inventor: Jozef Maria Finders, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 172 days.

(21) Appl. No.: 12/476,044

(22) Filed: Jun. 1, 2009

(65) Prior Publication Data

US 2009/0296060 A1 Dec. 3, 2009

Related U.S. Application Data

(60) Provisional application No. 61/129,080, filed on Jun. 3, 2008.

(51) Int. Cl.
*G03B 27/54* (2006.01)
*G03B 27/42* (2006.01)

(52) U.S. Cl. ............................................. 355/67; 355/53

(58) Field of Classification Search .................... 355/52, 355/53, 55, 67, 77; 250/548, 492.2; 356/399–401
See application file for complete search history.

(56) References Cited

U.S. PATENT DOCUMENTS

| | | | |
|---|---|---|---|
| 6,310,679 B1 * | 10/2001 | Shiraishi | 355/53 |
| 6,541,167 B2 * | 4/2003 | Petersen et al. | 430/5 |
| 6,549,266 B1 * | 4/2003 | Taniguchi | 355/53 |
| 7,525,640 B2 * | 4/2009 | Jansen et al. | 355/67 |
| 2008/0123066 A1 | 5/2008 | Jansen et al. | |

FOREIGN PATENT DOCUMENTS

JP 2007-317847 A 12/2007

OTHER PUBLICATIONS

Chinese Office Action dated Oct. 29, 2010 in related Chinese patent application No. 200910146623.9.

* cited by examiner

*Primary Examiner* — Hung Henry Nguyen
(74) *Attorney, Agent, or Firm* — Pillsbury Winthrop Shaw Pittman LLP

(57) ABSTRACT

A lithographic apparatus includes a phase adjuster to adjust a phase of an optical wave traversing an optical element of the phase adjuster during exposure of a pattern on a substrate. In an embodiment, the optical element is a heat controllable optical element in a projection system of the lithographic apparatus. In use, the pattern is illuminated with an illumination mode including an off-axis radiation beam. This beam is diffracted into zeroth-order and first-order diffracted beams oppositely and asymmetrically inclined with respect to an optical axis. An area is identified where the first-order diffracted beam traverses the optical element. An image characteristic of an image of the pattern is optimized by calculating a desired optical phase of the first-order diffracted beam in relation to the optical phase of the zeroth-order diffracted beam. The phase adjuster is controlled to apply the desired optical phase to the first order diffracted beam.

12 Claims, 11 Drawing Sheets

US 7,961,296 B2

LITHOGRAPHIC APPARATUS AND DEVICE MANUFACTURING METHOD

This application claims priority and benefit under 35 U.S.C. §119(e) to U.S. Provisional Patent Application No. 61/129,080, entitled "Lithographic Apparatus and Device Manufacturing Method", filed on Jun. 3, 2008. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to impart a beam of radiation with a pattern in its cross-section, the pattern corresponding to a circuit pattern to be formed on an individual layer of the IC. This pattern can be imaged or transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an image of the entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the semiconductor manufacturing industry there is increasing demand for ever-smaller features and increased density of features. The critical dimensions (CDs) are rapidly decreasing and are becoming very close to the theoretical resolution limit of state-of-the-art exposure tools such as steppers and scanners as described above. Conventional technologies aimed at enhancing resolution and minimizing printable CD include reducing the wavelength of the exposure radiation, increasing the numerical aperture (NA) of the projection system of the lithographic apparatus, and/or including features in a patterning device pattern smaller than the resolution limit of the exposure tool so that they will not print on the substrate, but so that they will produce diffraction effects which can improve contrast and sharpen fine features.

SUMMARY

Application of such conventional resolution enhancement techniques however may lead to a reduction of depth of focus within which, for example, imaging of desired patterns at resolution limit can be executed. A reduced depth of focus may lead to printed pattern errors beyond tolerance when, for example, a residual substrate unflatness cannot be compensated for during exposure.

It is desirable, for example, to alleviate, at least partially, a problem associated with a limited range of usable depth of focus using an embodiment of the invention.

According to an aspect of the invention, there is provided a lithographic apparatus comprising an illumination system configured to condition a radiation beam with an illumination mode including an off-axis radiation beam emerging from an illumination pole and inclined at an angle with respect to an optical axis; a support constructed to support a patterning device, the patterning device being capable of imparting the radiation beam with a pattern in its cross-section to form a patterned radiation beam and further being capable of diffracting the off-axis radiation beam into a zeroth-order diffracted beam and a first-order diffracted beam oppositely and asymmetrically inclined with respect to the optical axis; a projection system having a pupil plane and configured to project the patterned radiation beam onto a target portion of the substrate; a phase adjuster constructed and arranged to adjust a phase of an electric field of a radiation beam traversing an optical element of the phase adjuster disposed in the pupil plane; and a controller constructed and arranged to retrieve data representative of the pattern and of the illumination mode, to identify an area where the first-order diffracted beam traverses the pupil plane, to optimize an image characteristic of an image of the pattern by calculating a desired optical phase of the first-order diffracted beam in relation to the optical phase of the zeroth-order diffracted beam, to map the area on a portion of the optical element, and to apply heat to or extract heat from, the portion to change an index of refraction of the portion of the optical element in accordance with the desired optical phase.

According to an aspect of the invention, there is provided a lithographic apparatus comprising an illumination system configured to condition a radiation beam with a quadrupole illumination mode including a first and second beam, emerging from a respective first and adjacent second pole and both inclined at an angle with respect to an optical axis; a support constructed to support a patterning device, the patterning device being capable of imparting the radiation beam with a pattern in its cross-section to form a patterned radiation beam and further being capable of diffracting the first beam into a first zeroth-order beam and a first first-order beam oppositely and symmetrically inclined with respect to the optical axis, and of diffracting the second beam into a second zeroth-order beam and a second first-order beam oppositely and asymmetrically inclined with respect to the optical axis; a projection system having a pupil plane and configured to project the patterned radiation beam onto a target portion of the substrate; a phase adjuster constructed and arranged to adjust a phase of an electric field of a radiation beam traversing an optical element of the phase adjuster disposed in the pupil plane; and a controller constructed and arranged to retrieve data representative for the pattern and the quadrupole illumination mode, to identify an area where the second first-order beam traverses the pupil plane, to optimize depth of focus of an image of the pattern by calculating a desired optical phase of the second first-order beam, to map the area on a portion of the optical element, and to apply heat to or extract heat from, the portion to change an index of refraction of the portion of the optical element in accordance with the desired optical phase.

According to an aspect of the invention, there is provided a device manufacturing method comprising transferring a pattern from a patterning device onto a substrate, the method including illuminating, with a radiation beam having an illumination mode including an off-axis radiation beam emerging from an illumination pole and inclined at an angle with respect to an optical axis, a patterning device, the patterning device imparting the radiation beam with a pattern in its cross-section to form a patterned radiation beam and further diffracting the off-axis radiation beam into a zeroth-order diffracted beam and a first-order diffracted beam oppositely and asymmetrically inclined with respect to the optical axis; projecting the patterned radiation beam via a pupil plane onto a target portion of the substrate; adjusting a phase of an electric field of a radiation beam traversing an optical element disposed in the pupil plane, the adjusting including retrieving data representative of the pattern and of the illumination mode, identifying an area where the first-order diffracted beam traverses the pupil plane, optimizing an image characteristic of an image of the pattern by calculating a desired optical phase of the first-order diffracted beam in relation to the optical phase of the zeroth-order diffracted beam, mapping the area on a portion of the optical element, and applying heat to or extracting heat from, the portion to change an index of refraction of the portion of the optical element in accordance with the desired optical phase.

According to an aspect of the invention, there is provided a device manufacturing method comprising transferring a pattern from a patterning device onto a substrate, the method including illuminating, with a radiation beam with a quadrupole illumination mode including a first and second beam, emerging from a respective first and adjacent second pole and both inclined at an angle with respect to an optical axis, a patterning device, the patterning device imparting the radiation beam with a pattern in its cross-section to form a patterned radiation beam and further diffracting the first beam into a first zeroth-order beam and a first first-order beam oppositely and symmetrically inclined with respect to the optical axis, and diffracting the second beam into a second zeroth-order beam and a second first-order beam oppositely and asymmetrically inclined with respect to the optical axis; projecting the patterned radiation beam via a pupil plane onto a target portion of the substrate; and adjusting a phase of an electric field of a radiation beam traversing an optical element disposed in the pupil plane, the adjusting including retrieving data representative for the pattern and the quadrupole illumination mode, identifying an area where the second first-order beam traverses the pupil plane, optimizing depth of focus of an image of the pattern by calculating a desired optical phase of the second first-order beam, mapping the area on a portion of the optical element, and applying heat to or extracting heat from, the portion to change an index of refraction of the portion of the optical element in accordance with the desired optical phase.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
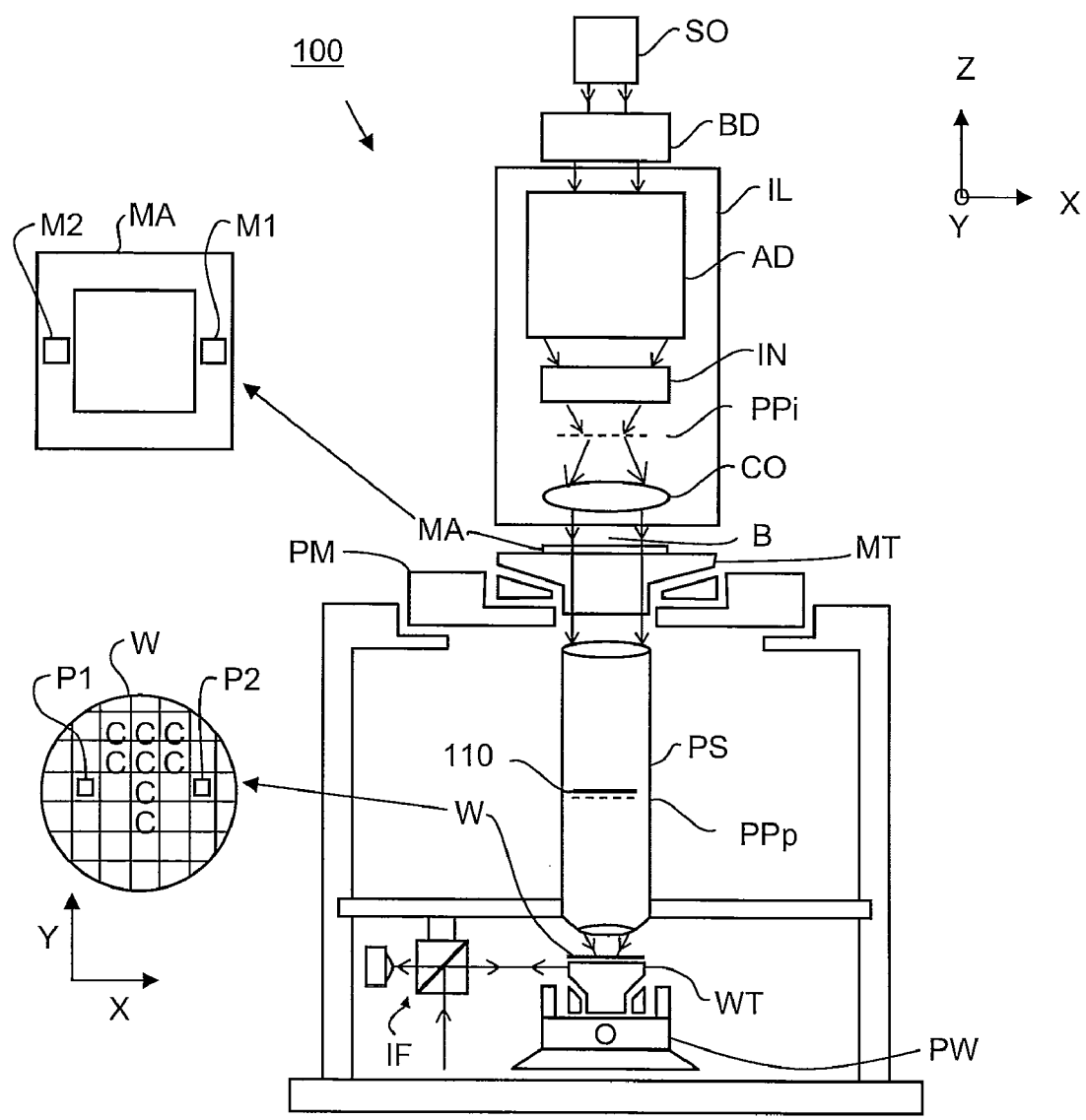
FIG. 1 depicts a lithographic apparatus according to an embodiment of the invention.

FIG. 1 schematically depicts a lithographic apparatus 100 according to an embodiment of the invention. The apparatus 100 comprises:

an illumination system (illuminator) IL configured to condition a radiation beam B (e.g. UV radiation, for example generated by an excimer laser operating at a wavelength of 248 nm or 193 nm, or EUV radiation, for example generated by a laser-fired plasma source operating at about 13.6 nm wavelength);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. It holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus 100 is of a transmissive type (e.g. employing a transmissive mask). Alternatively, the apparatus may be of a reflective type (e.g. employing a programmable mirror array of a type as referred to above, or employing a reflective mask).

The lithographic apparatus 100 may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus 100 may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus 100 could be used in at least one of the following modes:

In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The optical arrangement of the apparatus of FIG. 1 uses Koehler illumination. With Koehler illumination, a pupil plane $PP_i$ in the illumination system IL is conjugate to a pupil plane $PP_p$ of the projection system PS. The pupil plane $PP_p$ is a Fourier transform plane of the object plane in which the patterning device MA is located. As is conventional, an illumination mode of this apparatus can be described by reference to the distribution of intensity of the radiation of the beam B in the pupil plane $PP_i$ of the illumination system. The distribution of intensity in the pupil plane $PP_p$ of the projection system PS will be substantially the same as the distribution of intensity in the pupil plane $PP_i$ of the illumination system, subject to diffraction effects of the pattern of the patterning device MA.

Figure 2:
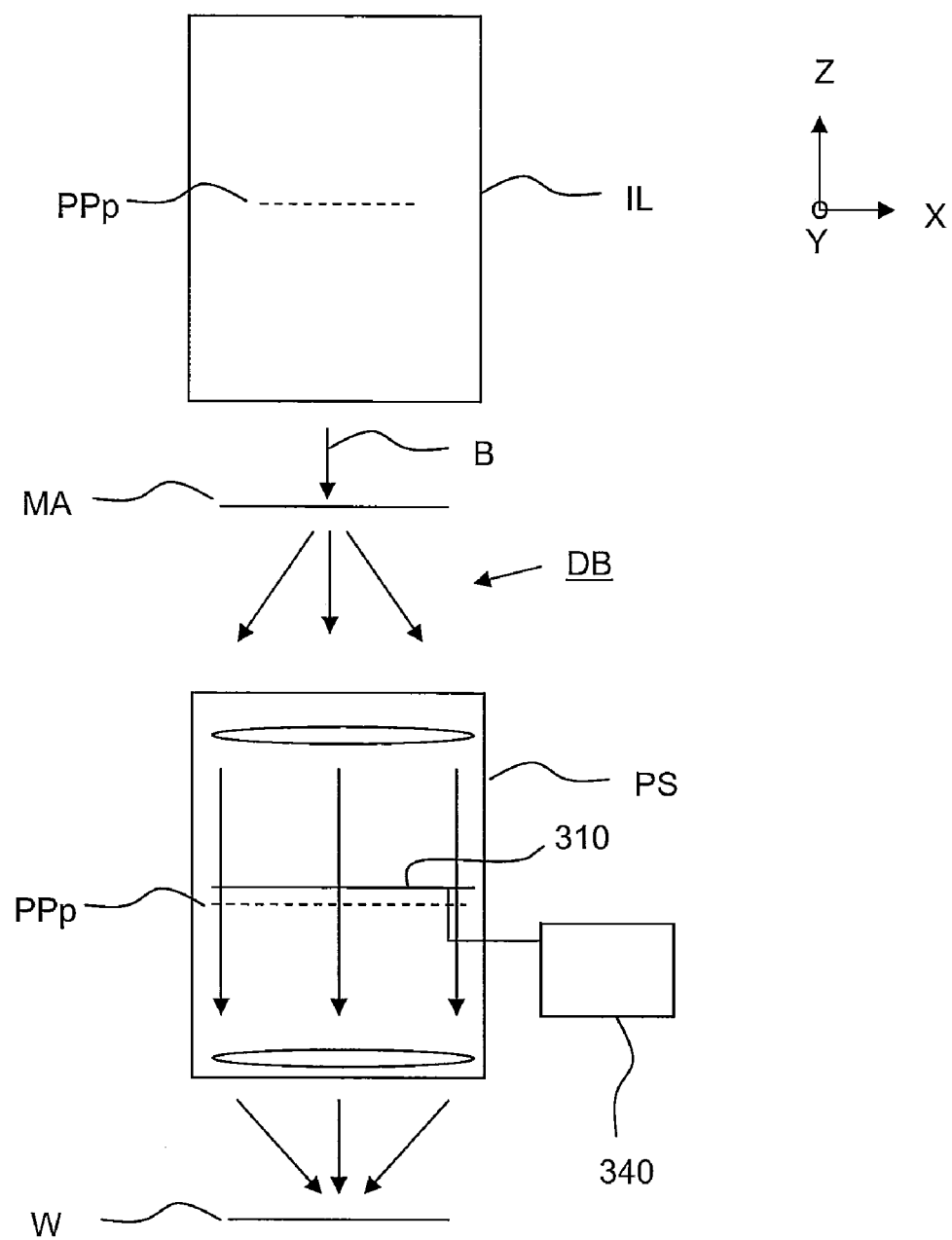
FIG. 2 illustrates a phase adjuster configured to change a phase of an electromagnetic wave traversing a projection system of the lithographic apparatus.

The projection system PS comprises a phase adjuster 110 constructed and arranged to adjust a phase of an electric field of an optical radiation beam traversing the projection system. As schematically shown in FIG. 2, the phase adjuster 110 may comprise an optical element 310 of a material substantially transmissive for radiation of the beam B. In an embodiment, the optical element 310 may be reflective for radiation of the beam 340. The phase adjuster 110 may further comprise a controller 340. An optical path length for a wave traversing the element 310 is adjustable in response to a signal supplied by controller 340. The optical element 310 may be disposed or disposable, for example, substantially in a Fourier Transform plane such as the pupil PPp, and such that—in use—it is traversed by diffracted beams DB emanating from the patterning device.

Figure 3:
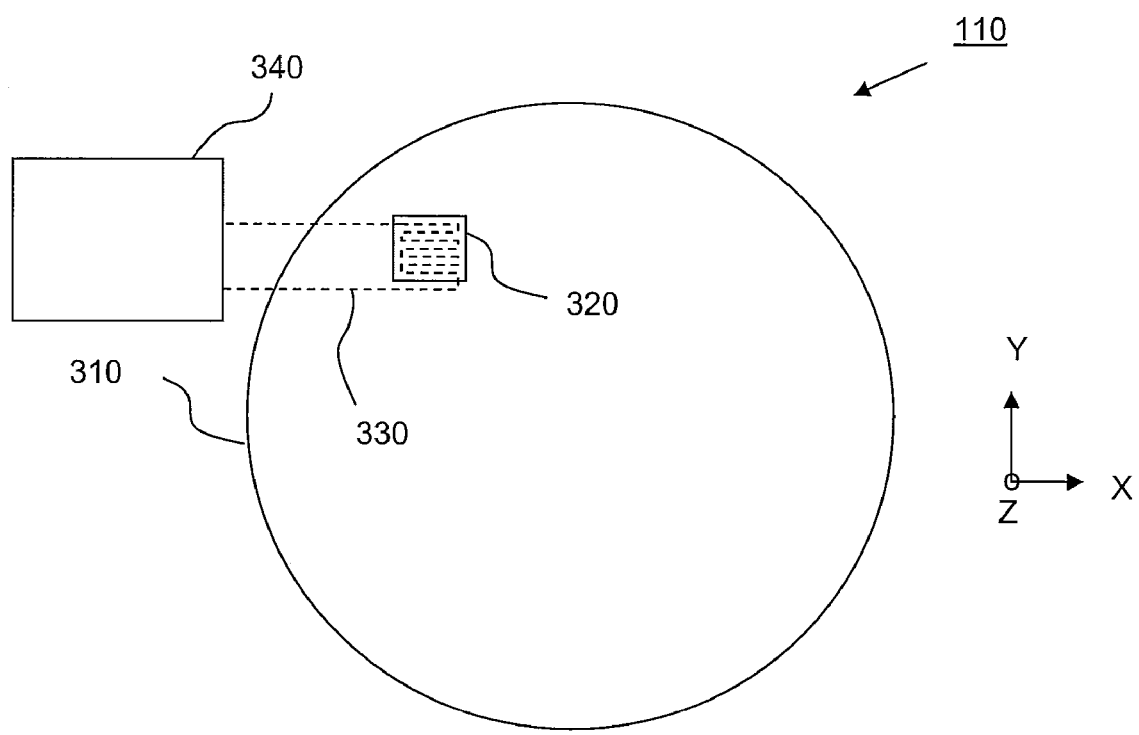
FIG. 3 illustrates an optical element included in the phase adjuster.

FIG. 3 illustrates the phase adjuster 110 in more detail, and shows a top view, along the Z-axis, of the optical element 310. An adjustment of a phase of an optical wave traversing the element 310 may be obtained by applying heat to, or removing heat from, a portion 320 of the optical element 310, thereby introducing a local change of index of refraction of the material of the element relative to the refractive index of the material adjacent to the portion 320. The application of heat can be realized by, for example, transmitting an electrical current through a wire 330 having Ohmic resistance and being arranged in contact with the portion 320 of the element and with the controller 340 arranged to provide the current to the wire 330.

Figure 4:
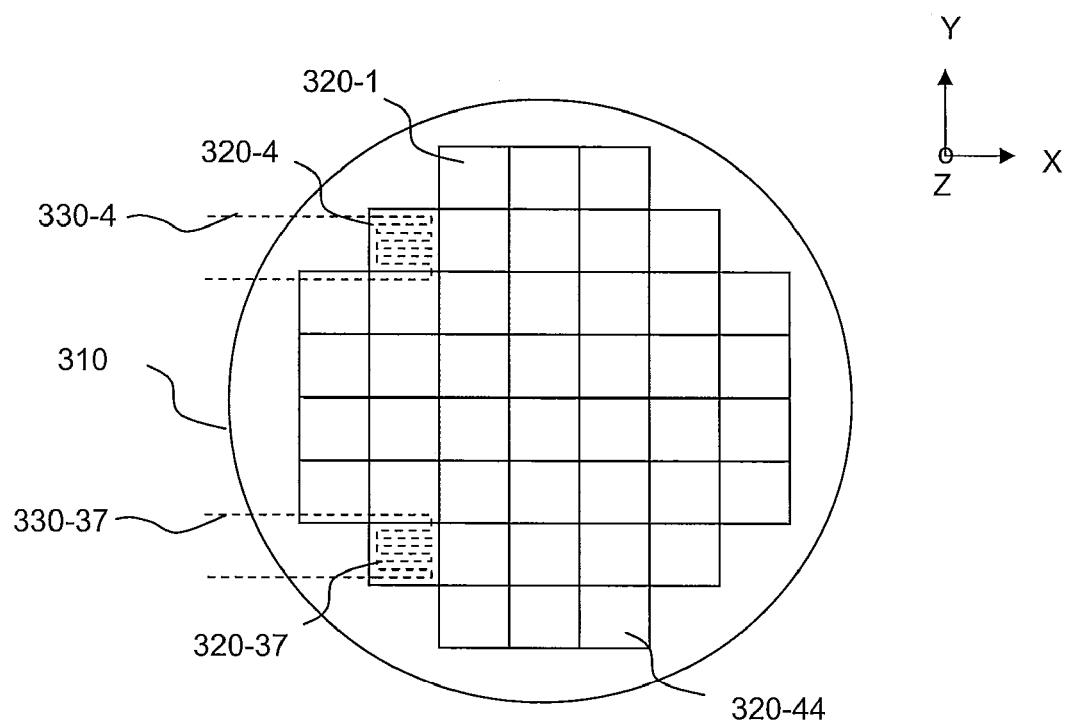
FIG. 4 depicts temperature controllable portions of the optical element included in the phase adjuster.

A plurality of adjacent portions of the optical element may be provided with a corresponding plurality of wires for heating any portion independently from any other portion. For example, as schematically illustrated in FIG. 4, adjacent portions 320-1 up to 320-44 are disposed in adjacent rows and numbered from left to right and from top to bottom. Each portion 320 of the portions 320-1 up to 320-44 is provided with correspondingly numbered heating wires 330-1 up to 330-44 (although FIG. 4, merely for clarity sake, illustrates this only for the portions 320-4 and 320-37). The controller 340 is constructed and arranged such that each wire can be current-activated independently. This enables application of a spatial phase distribution to an optical wave traversing the element 310, in accordance with a spatial distribution of the temperature over the element 310 in the X,Y plane.

In addition or alternatively, the optical element 310 may include a channel arranged to contain a cooling fluid. The phase adjuster 110 may include a cooling fluid supply and retrieval system connected to the channel and arranged to circulate cooling fluid at a controlled temperature through the channel. Like the wires 330, a cooling channel may be associated with each portion 320; however, alternatively a single cooling channel may be arranged for all portions 320. A cooling of the element 310 in combination with heating a portion 320 of the element 310 may enable adjusting the temperature of the portion 320 within a range of temperatures extending both below and above a nominal temperature. The nominal temperature may, for example, be a specified desired operating temperature of the apparatus 100 or of the material of the optical elements of the projection system PS.

Embodiments of a phase adjuster 110 can be gleaned from U.S. Pat. No. 7,525,640. A total number of portions 320 is not limited to 44. Instead it may in general depend on a desired spatial resolution of temperature distributions. For example, a ratio of the area of each of the portions 320 to the size of a clear area in the pupil plane PPi of the projection system PS may be between 100 and 1000.

It is noted that the invention is not limited to the specific embodiment, described above, of the phase adjuster 110. Such an embodiment is presented herein for illustrative purposes only. Additional embodiments will be apparent to persons skilled in the relevant art(s) based on the teachings contained herein. For example, an alternative phase adjuster 110 may include an infrared laser arranged to selectively heat portions 320 of an optical element 310 disposed near the lens pupil $PP_p$. The infrared radiation may be guided to selected portions of the optical element by means of, for example, one or more hollow optical fibers. Details of the infrared laser arrangement for this embodiment can be gleaned from Japanese patent application publication no. JP 2007317847 A. In the absence of a cooling arrangement, temperatures of different portions 320 can be arranged to mutually differ from each other by supplying corresponding mutually different amounts of infrared radiation energy to the corresponding different portions. A nominal temperature may then be specified as, for example, the average temperature value of the mutually different temperatures.

Figure 5:
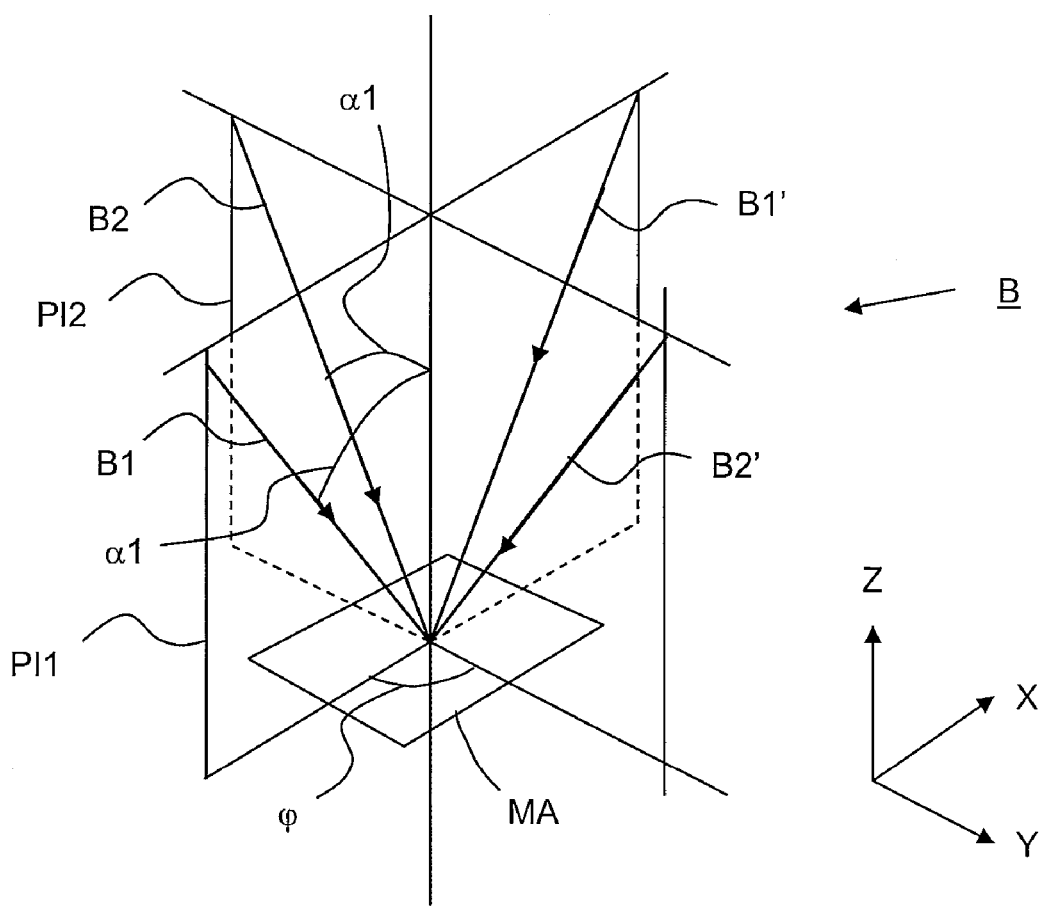
FIG. 5 a quadrupole illumination mode.

In the embodiment, a patterning device pattern provided by the patterning device MA is illuminated using a conventional quadrupole illumination mode, illustrated in FIG. 5. The beam B includes a first radiation beam B1 inclined at an angle $\alpha1$ with respect to the Z-axis (which is substantially normal to the patterning device MA) in a first plane of incidence PI1 and a second radiation beam B2, also inclined at an angle $\alpha1$ with respect to the patterning device in a second plane of incidence PI2. The second plane of incidence PI2 is arranged at an angle $\phi$ with respect to the plane PI1. The beam B further includes beams B1' and B2' respectively arranged symmetrically opposite to the respective beams B1 and B2. The angle $\phi$ is 90 degrees in the embodiment, but is not limited to this value. The planes PI1 and PI2 are respectively an X-Z plane and an Y-Z plane in the embodiment, but can also be chosen at other rotational orientations with respect to the Z-axis.

Figure 6:
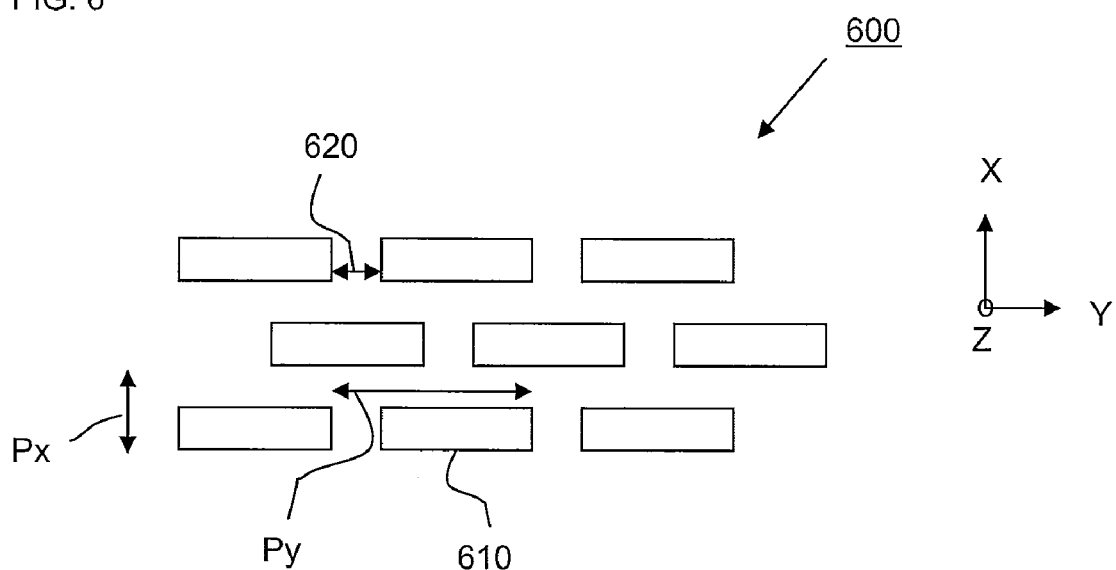
FIG. 6 illustrates a pattern generated by a patterning device.

The patterning device pattern 600 may consist of a brick-wall type DRAM pattern as shown in FIG. 6. The axes of the line segments 610 (the longer axes of the bricks) are substantially parallel to the Y-direction. The line segments 610 are arranged at a pitch Px along the X-direction (perpendicular to the longer axes of the bricks). The gaps 620 are defined by the separation between two adjacent line segments along a single line. The arrangement of gaps 620 defines a pitch Py along the Y-direction.

In the embodiment, the value of pitch Px is 100 nm, and the width of the line segments 610 is 50 nm. The width of the gaps 620 is 65 nm. The projection process for printing the pattern 600 is characterized by the projection system PS having a NA of 1.2 and the radiation of the beam B having a wavelength of 193 nm.

Figure 7:
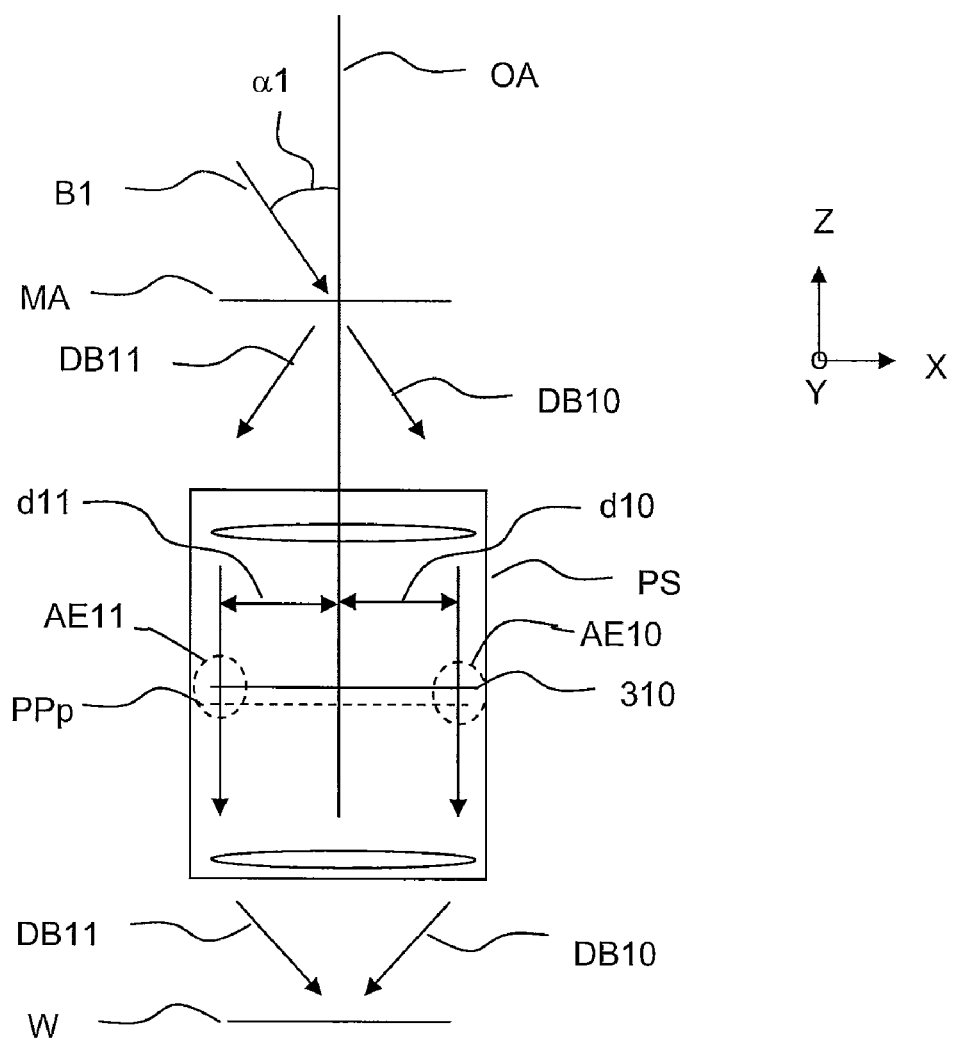
FIG. 7 depicts diffracted beams originating from a single pole of the quadrupole illumination mode.

As illustrated in FIG. 7, the patterning device pattern 600 diffracts the beam B1 into a zero and a first order diffracted beam, respectively the beams DB10 and DB11. The beams DB10 and DB11 traverse a Fourier Transform plane in the projection system PS, e.g. the pupil plane PPp. The angle $\alpha 1$ is arranged such that the traversing of the pupil plane PPp occurs in respective opposite areas AE10 and AE11 disposed symmetrically with respect to the optical axis OA (parallel to the Z-axis), at respective equal distances d10 and d11 (d10=d11) from the optical axis OA.

Figure 8:
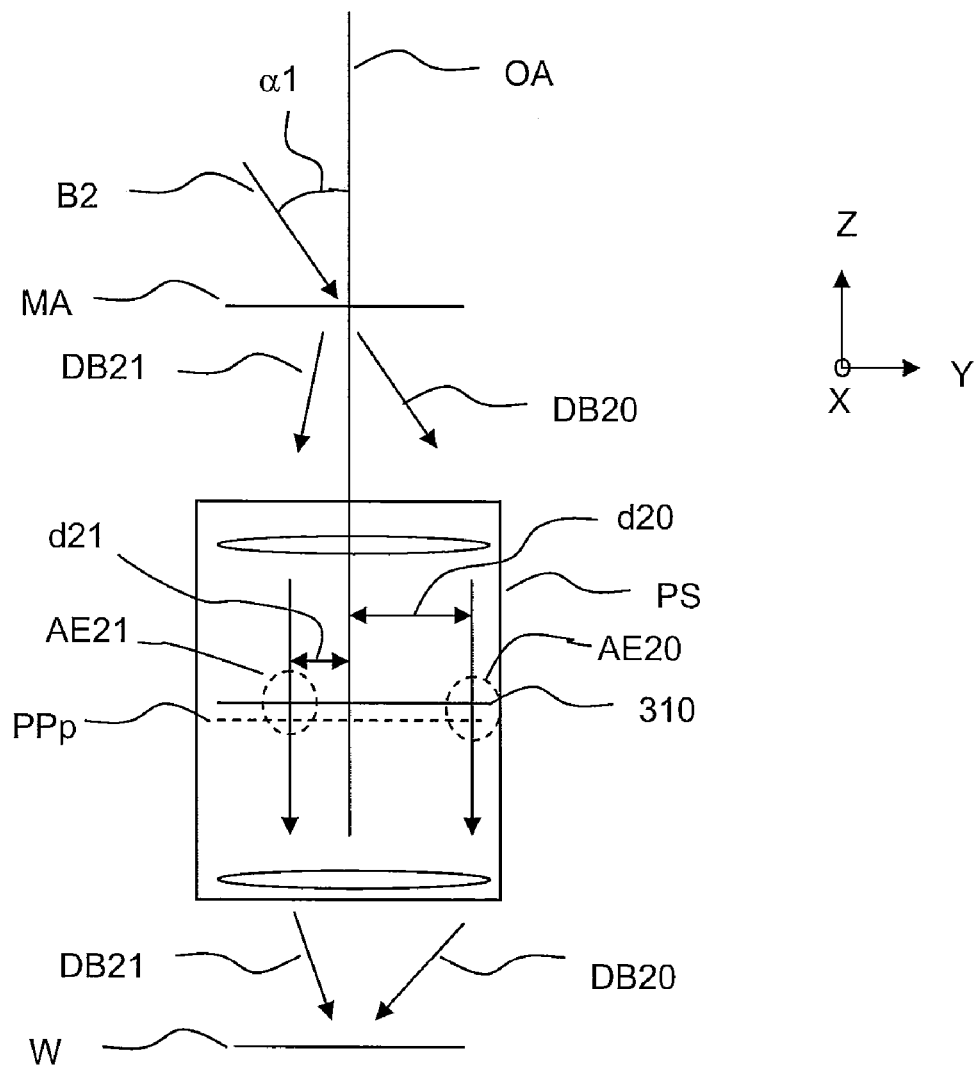
FIG. 8 depicts diffracted beams originating from a pole of the quadrupole illumination mode adjacent to the pole of FIG. 7.

As illustrated in FIG. 8, the patterning device pattern further diffracts the beam B2 into a zero and a first order diffracted beam, respectively beams DB20 and DB21. The beams DB20 and DB21 traverse a Fourier Transform plane in the projection system PS, e.g. the pupil plane PPp, in respective opposite areas AE20 and AE21. In contrast to the areas AE10 and AE11, the areas AE20 and A21 are disposed asymmetrically with respect to the optical axis OA, at respective different distances d20 and d21 from the optical axis OA. The difference between the diffracted beams originating from B1 and B2 is related to the difference between the pitches Px and Py of the line segments 610 and the gaps 620. In particular, in comparison to features arranged at shorter pitch, features arranged at a longer pitch are less effective in diffracting radiation away from a zeroth order diffracted beam direction of a patterning device-illuminating beam.

In the presence of quadrupole illumination such as illustrated in FIG. 5, an image of a line segment 610 and of a gap 620 can be represented as a sum of 4 images, respectively generated by radiation emanating from the four respective poles of the quadrupole illumination intensity distribution in the illumination pupil plane PPi. A first image im1 is generated by the recombination of the beams DB10 and DB11 diffracted from B1, see FIG. 7, just above and at the substrate W. This image contributes mainly to contrast and resolution along the X-direction in the image of the brick-pattern 600, resolving the line shaped spaces between the bricks 610 along the X-direction better than the gaps 620 between the bricks 610. Similarly, diffracted beams generated by diffraction of the beam B1' provide a similar first additional image im1'. A second image im2 is generated by the recombination of the beams DB20 and DB21 diffracted from B2, see FIG. 8, just above and at the substrate. This second image contributes mainly to contrast and resolution along the Y-direction in the image of the pattern 600, resolving the gaps 620 between the bricks 610 better than the line shaped spaces between the bricks 610 along the X-direction. A similar, second additional image im2' originates from diffracted beams generated by diffraction of the beam B2' at the patterning device pattern 600.

Near and at the image plane an inclination with respect to the Z-axis of the beams DB10 and DB11 is proportional to the distance d10 and d11, respectively, in the pupil plane PPp. Hence, near the image plane, the beams DB10 and DB11 recombine at opposed and substantially equal inclinations with respect to Z-axis (which is substantially normal to the substrate W) to form the first image. The type of imaging where two beams recombine at equal but opposite angles of inclination is referred to as symmetric two-beam imaging. The formation of the first additional image im1' is characterized by such a symmetric two-beam imaging as well.

With the combined two images im1 and im1' there is associated a depth of focus, denoted here by DoFx. It is a distance along the Z-axis within which a defocus of the substrate W during exposure is not causing an error beyond tolerance of the width of the line segments 610 as printed in the resist. This width is the critical dimension CD, the smallest printable dimension of the pattern. The depth of focus DoFx is 300 nm in the embodiment. Similarly, one can associate a depth of focus with the imaging of the gaps 620, i.e., with the combined images im2 and im2'. In contrast to the imaging associated with the radiation originating from the beams B1 and B1', the image formation of image im2 by the beams DB20 and DB21 (originating from the beam B2) is not a symmetric two-beam imaging, because the angles of inclination of the beams DB20 and DB21 with respect to the Z-axis, near the image plane, are different. Such a non-symmetric two-beam imaging is less desirable because the lack of symmetry may lead to a reduction of depth of focus. In the embodiment a consequence would be that the depth of focus of the combined images im1 and im1' is larger than the depth of focus of the combined images im2 and im2'. The latter depth of focus is referred to as DoFy. In the embodiment, to substantially avoid such a difference between depths of focus DoFx and DoFy, a first change of optical phase is applied to the beam DB21 and a second change of optical phase is applied to the beam DB21'; these changes of phase are changes relative to the phase of the respective zeroth order beams DB20 and DB20'. Further, no such relative phase changes are applied to the other zeroth order and first order diffracted beams DB10, DB11, DB10', and DB11'.

Figure 9:
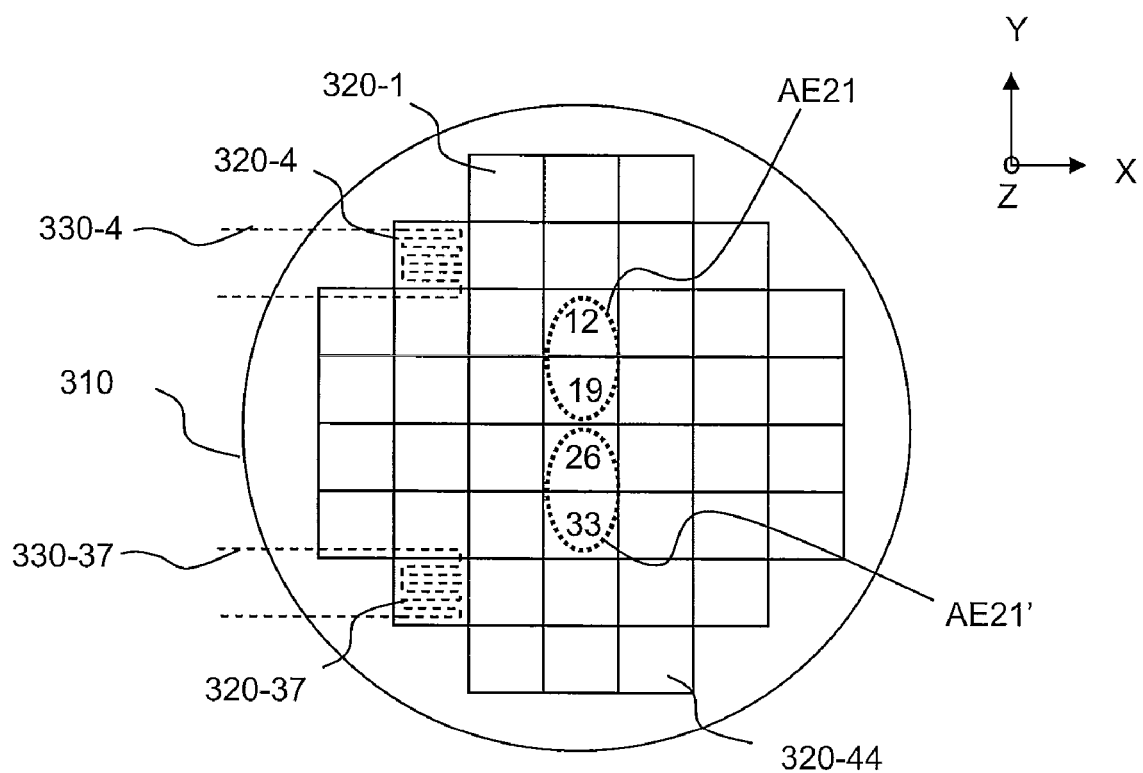
FIG. 9 depicts areas traversed by diffracted beams to which a change of phase is applied in an embodiment.

The phase adjuster 110 is used to provide desired phase changes to the beams DB21 and DB21'. First, data representative for the patterning device pattern 600 and the illumination mode are retrieved, by controller 340, from a patterning-device data-file and a file including illumination mode setting data. Next, an intensity distribution in the pupil plane PPp of the projection system is predicted based on data including the pattern and illumination data. Areas AE21 and AE21' (the latter not shown in FIG. 8) are identified where the beams DB21 and DB21' traverse the optical element 310 of phase adjuster 110. A lithographic process optimization, e.g. arranged to optimize depth of focus, is executed by the controller 340. Optimization variables used in the optimization include the aforementioned first and second change of optical phase. Desired first and second optical phases are calculated and stored. The identified areas AE21 and AE21' are mapped on the portions 320 of the optical element 310, and portions 320 substantially traversed by the respective beams DB21 and DB21' are identified and their addresses in relation to corresponding heating wires and/or cooling channels are stored. In an embodiment, the area AE21 is assumed to correspond to the portions 320-12 and 320-19, as illustrated in FIG. 9. Similarly, the area AE21' is assumed to correspond to the portions 320-26 and 320-33.

In the embodiment, the desired phase change for beam DB21 is a fraction $90/193$ of $2\pi$, and the desired phase change for beam DB21' is of equal magnitude but of opposite sign compared to the first phase change. The controller converts the desired phase changes into a respective desired first temperature for the portions 320-12 and 320-19 and a desired second temperature for the portions 320-26 and 320-33, at opposite temperature intervals from a desired nominal temperature for any of the other portions 320-1 up to 320-44, and determines and applies corresponding currents to the heating wires (and/or cooling fluid temperature to the channels).

As noted above, the invention is not limited to the specific embodiment of the phase adjuster 110. For example, an alternative phase adjuster 110 may include an infrared laser arranged to selectively heat portions 320 of an optical element 310 disposed near the lens pupil $PP_p$.

A simulation predicts that applying the first and second phase changes as described above may result in an increase of depth of focus for the images im2 and im2'.

Figure 10:
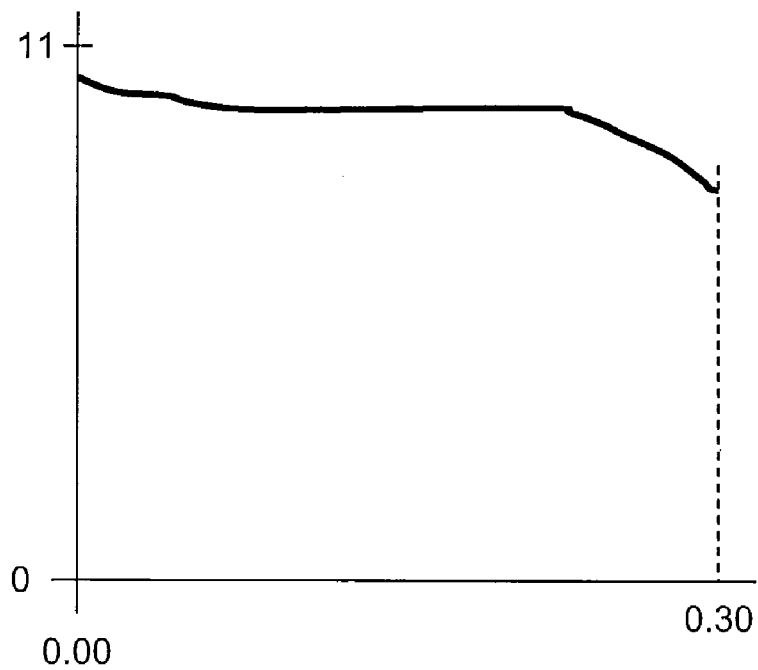
FIG. 10a illustrates a first aspect of exposure latitude versus depth of focus for printing the pattern of FIG. 6 in the presence of phase changes applied according to an embodiment.
FIG. 10b illustrates a second aspect of exposure latitude versus depth of focus for printing the pattern of FIG. 6 in the presence of phase changes applied according to an embodiment.
FIG. 10c illustrates the first aspect of exposure latitude versus depth of focus for printing the pattern of FIG. 6 in the absence of phase changes.
FIG. 10d illustrates the second aspect of exposure latitude versus depth of focus for printing the pattern of FIG. 6 in the absence of phase changes.
Figure 10:
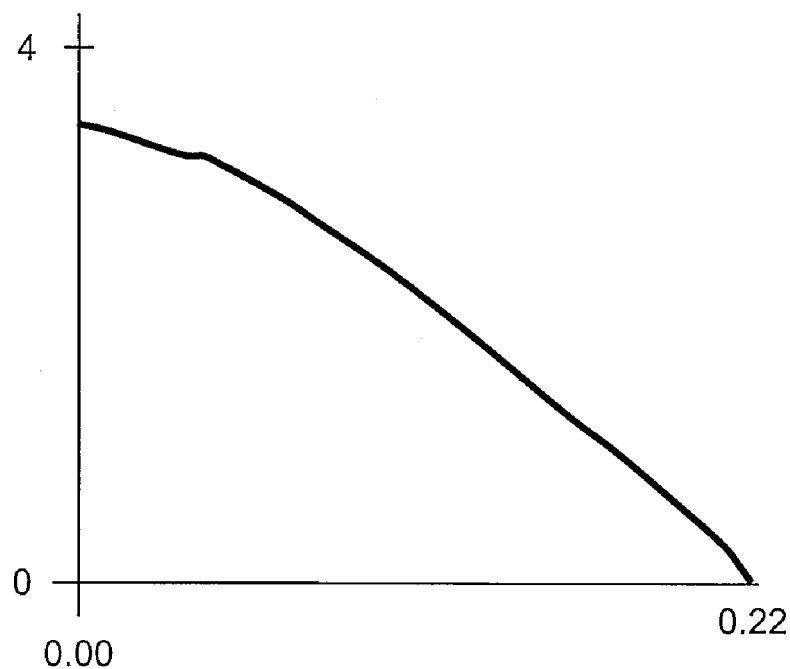
Figure 10:
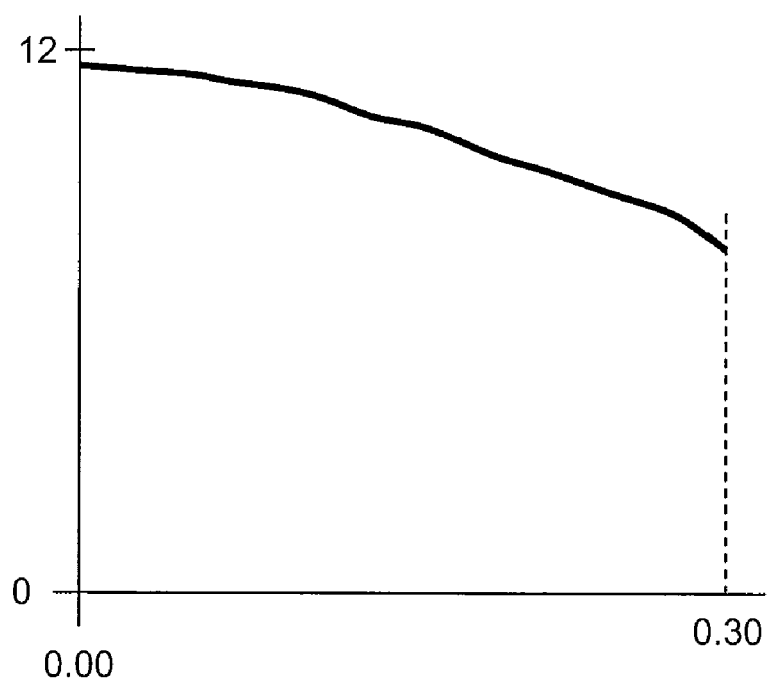
Figure 10:
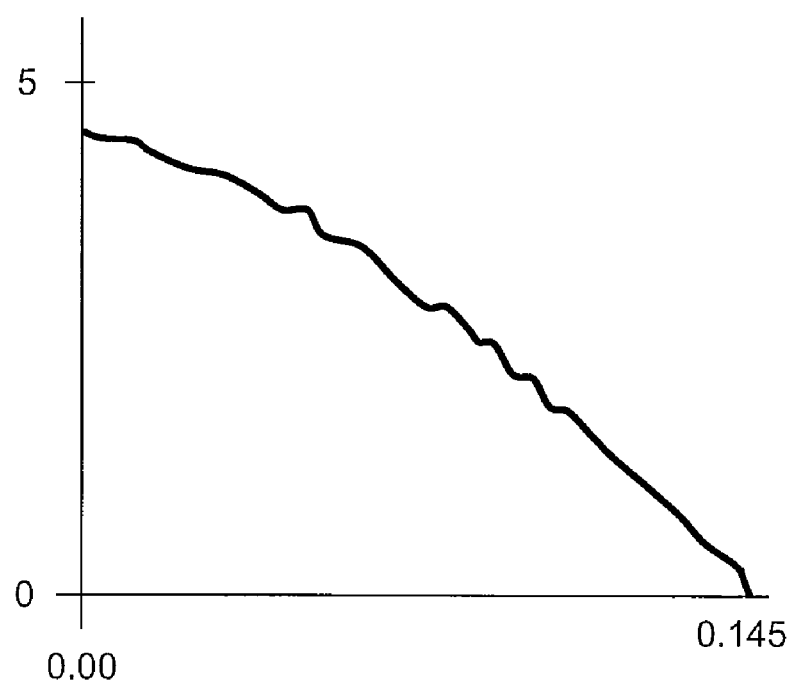

FIG. 10a illustrates the simulated exposure latitude versus depth of focus DoFx for printing the widths of the line segments 610 in the X-direction, in the presence of the applied first and second phase changes. Along the vertical axis of FIG. 10a, the exposure latitude in percentage is plotted; along the horizontal axis the depth of focus in micrometers (μm) is plotted.

FIG. 10b illustrates the simulated exposure latitude versus depth of focus DoFy for printing the gaps 620 between the line segments 610, in the presence of the applied first and second phase changes. Along the vertical axis in FIG. 10b, the exposure latitude in percentage is plotted; along the horizontal axis the depth of focus in micrometers (μm) is plotted.

FIG. 10c illustrates the simulated exposure latitude versus depth of focus DoFx for printing the widths of the line segments 610 in the X-direction, in the absence of applying first and second phase changes. Along the vertical axis in FIG. 10c, the exposure latitude in percentage is plotted; along the horizontal axis the depth of focus in micrometers (μm) is plotted.

FIG. 10d illustrates the simulated exposure latitude versus depth of focus DoFy for printing the gaps 620 between the line segments 610, in the absence of applying the applied first and second phase changes. Along the vertical axis in FIG. 10d, the exposure latitude in percentage is plotted; along the horizontal axis the depth of focus in micrometer (μm) is plotted.

As illustrated in these FIGS. 10a-d, at an exposure latitude of 1%, the depth of focus DoFy for an image of a gap increased from approximately 125 nm to 180 nm by applying the first and second phase changes. The increase of depth of focus may be obtained without substantially affecting overlay performance, that is, without an associated shift of the location of an image of a gap 620 in the X-Y plane at the substrate W. In addition, the increase of depth of focus DoFy may be obtained without substantially reducing the depth of focus DoFx associated with contrast along the X-direction in the image of pattern 600, needed to print edges of the line segments 610 along the long axis of the bricks 610 at a position within tolerance.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
an illumination system configured to condition a radiation beam with an illumination mode including an off-axis radiation beam emerging from an illumination pole and inclined at an angle with respect to an optical axis;
a support constructed to support a patterning device, the patterning device being capable of imparting the radiation beam with a pattern in its cross-section to form a patterned radiation beam and further being capable of diffracting the off-axis radiation beam into a zeroth-order diffracted beam and a first-order diffracted beam oppositely and asymmetrically inclined with respect to the optical axis;
a projection system having a pupil plane and configured to project the patterned radiation beam onto a target portion of the substrate;
a phase adjuster constructed and arranged to adjust a phase of an electric field of a radiation beam traversing an optical element of the phase adjuster disposed in the pupil plane; and
a controller constructed and arranged to retrieve data representative of the pattern and of the illumination mode, to identify an area where the first-order diffracted beam traverses the pupil plane, to optimize an image characteristic of an image of the pattern by calculating a desired optical phase of the first-order diffracted beam in relation to the optical phase of the zeroth-order diffracted beam, to map the area on a portion of the optical element, and to apply heat to or extract heat from, the portion to change an index of refraction of the portion of the optical element in accordance with the desired optical phase.

2. The lithographic apparatus of claim 1, wherein:
the illumination mode is a quadrupole illumination mode including a first and a second beam, emerging from a respective first and an adjacent second pole and both inclined at the angle with respect to the optical axis;
the off-axis radiation beam is the second beam; and the patterning device is capable of diffracting the first beam into a zeroth-order beam and a first-order beam oppositely and symmetrically inclined with respect to the optical axis.

3. The lithographic apparatus of claim 2, wherein the image characteristic is a depth of focus.

4. The lithographic apparatus of claim 1, wherein the image characteristic is a depth of focus.

5. A device manufacturing method comprising transferring a pattern from a patterning device onto a substrate, the method including:
   illuminating, with a radiation beam having an illumination mode including an off-axis radiation beam emerging from an illumination pole and inclined at an angle with respect to an optical axis, a patterning device, the patterning device imparting the radiation beam with a pattern in its cross-section to form a patterned radiation beam and further diffracting the off-axis radiation beam into a zeroth-order diffracted beam and a first-order diffracted beam oppositely and asymmetrically inclined with respect to the optical axis;
   projecting the patterned radiation beam via a pupil plane onto a target portion of the substrate;
   adjusting a phase of an electric field of a radiation beam traversing an optical element disposed in the pupil plane, the adjusting including:
      retrieving data representative of the pattern and of the illumination mode,
      identifying an area where the first-order diffracted beam traverses the pupil plane,
      optimizing an image characteristic of an image of the pattern by calculating a desired optical phase of the first-order diffracted beam in relation to the optical phase of the zeroth-order diffracted beam,
      mapping the area on a portion of the optical element, and
      applying heat to or extracting heat from, the portion to change an index of refraction of the portion of the optical element in accordance with the desired optical phase.

6. The method of claim 5, wherein:
   the illumination mode is a quadrupole illumination mode including a first and a second beam, emerging from a respective first and an adjacent second pole and both inclined at the angle with respect to the optical axis;
   the off-axis radiation beam is the second beam; and
   the patterning device diffracts the first beam into a zeroth-order beam and a first-order beam oppositely and symmetrically inclined with respect to the optical axis.

7. The method of claim 6, wherein the image characteristic is a depth of focus.

8. The method of claim 5, wherein the image characteristic is a depth of focus.

9. A non-transitory data storage medium having a computer program stored therein, the computer program containing one or more sequences of machine-readable instructions configured to execute a method to adjust a phase of an electric field of a radiation beam traversing an optical element disposed in a pupil plane, the adjusting including:
   retrieving data representative of a pattern of a patterning device to be transferred from the patterning device onto a substrate;
   retrieving data representative of an illumination mode including an off-axis radiation beam emerging from an illumination pole and inclined at an angle with respect to an optical axis, wherein a radiation beam having the illumination mode illuminates the patterning device, wherein the patterning device imparts the radiation beam with a pattern in its cross-section to form a patterned radiation beam and wherein the patterning device diffracts the off-axis radiation beam into a zeroth-order diffracted beam and a first-order diffracted beam oppositely and asymmetrically inclined with respect to the optical axis;
   identifying an area where the first-order diffracted beam traverses the pupil plane;
   optimizing an image characteristic of an image of the pattern by calculating a desired optical phase of the first-order diffracted beam in relation to the optical phase of the zeroth-order diffracted beam;
   mapping the area on a portion of the optical element; and
   causing application of heat to or extraction of heat from, the portion to change an index of refraction of the portion of the optical element in accordance with the desired optical phase, wherein the patterned radiation beam is projected via the pupil plane onto a target portion of the substrate.

10. The non-transitory data storage medium of claim 9, wherein:
   the illumination mode is a quadrupole illumination mode including a first and a second beam, emerging from a respective first and an adjacent second pole and both inclined at the angle with respect to the optical axis;
   the off-axis radiation beam is the second beam; and
   the patterning device diffracts the first beam into a zeroth-order beam and a first-order beam oppositely and symmetrically inclined with respect to the optical axis.

11. The non-transitory data storage medium of claim 10, wherein the image characteristic is a depth of focus.

12. The non-transitory data storage medium of claim 9, wherein the image characteristic is a depth of focus.

* * * * *